United States Patent
Johnson et al.

(10) Patent No.: US 10,896,704 B2
(45) Date of Patent: *Jan. 19, 2021

(54) APPARATUS WITH A CALIBRATION MECHANISM

(71) Applicant: Micron Technology, Inc., Boise, ID (US)

(72) Inventors: Jason M. Johnson, Nampa, ID (US); Jung-Hwa Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/692,306

(22) Filed: Nov. 22, 2019

(65) Prior Publication Data

US 2020/0111516 A1  Apr. 9, 2020

Related U.S. Application Data

(63) Continuation of application No. 16/151,604, filed on Oct. 4, 2018, now Pat. No. 10,504,571.

(51) Int. Cl.
*G11C 11/4076* (2006.01)
*G11C 11/408* (2006.01)
*G11C 7/10* (2006.01)
*G11C 7/22* (2006.01)

(52) U.S. Cl.
CPC .............. *G11C 7/222* (2013.01); *G11C 7/109* (2013.01); *G11C 7/1063* (2013.01); *G11C 11/4076* (2013.01); *G11C 11/4087* (2013.01); G11C 2207/105 (2013.01); G11C 2207/2254 (2013.01)

(58) Field of Classification Search
CPC ....... G11C 7/222; G11C 7/1063; G11C 7/109; G11C 11/4076; G11C 11/4087; G11C 2207/105; G11C 2207/2254
USPC ........................................ 365/233.13, 51, 63
See application file for complete search history.

(56) References Cited

U.S. PATENT DOCUMENTS

| | | | |
|---|---|---|---|
| 6,492,853 B1 * | 12/2002 | Latham | H03K 19/1732 326/37 |
| 9,520,164 B1 | 12/2016 | Yamamoto et al. | |
| 9,767,921 B1 | 9/2017 | Pan | |
| 9,935,632 B1 | 4/2018 | Gans | |
| 10,205,451 B1 * | 2/2019 | Johnson | G11C 7/1084 |
| 10,394,473 B2 | 8/2019 | Gans | |
| 10,439,612 B1 * | 10/2019 | Johnson | G11C 7/1057 |
| 10,504,571 B1 * | 12/2019 | Johnson | G11C 29/028 |
| 2011/0115509 A1 | 5/2011 | Kim et al. | |
| 2014/0016404 A1 | 1/2014 | Kim et al. | |
| 2015/0323971 A1 | 11/2015 | Arai et al. | |
| 2017/0109091 A1 | 4/2017 | Gans | |
| 2018/0167055 A1 * | 6/2018 | Gans | G11C 29/025 |

(Continued)

*Primary Examiner* — Ly D Pham
(74) *Attorney, Agent, or Firm* — Perkins Coie LLP

(57) ABSTRACT

An apparatus includes: a master die; one or more slave dies; a ZQ resister between a first node and a second node coupled to a voltage terminal; a ZQ pad coupled to each of the first node of the ZQ resister, the master die and the one or more slave dies; and a calibration channel electrically coupling the master die and the one or more slave dies, the calibration channel configured to communicate signals between the master die and the one or more slave dies for coordinating access to the ZQ pad across the master die and the one or more slave dies.

20 Claims, 8 Drawing Sheets

(56) References Cited

U.S. PATENT DOCUMENTS

2018/0375692 A1* 12/2018 Wieduwilt ............. G11C 16/32
2019/0206478 A1 7/2019 Jun

* cited by examiner

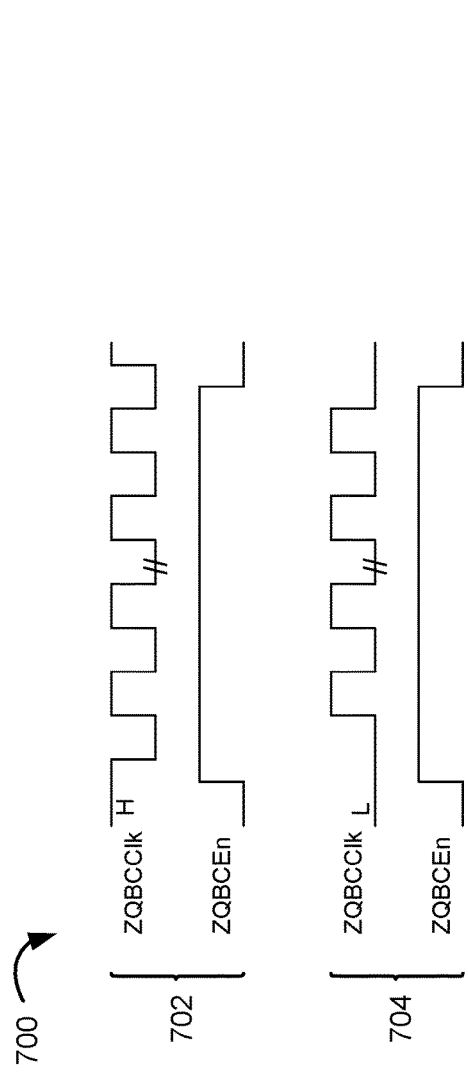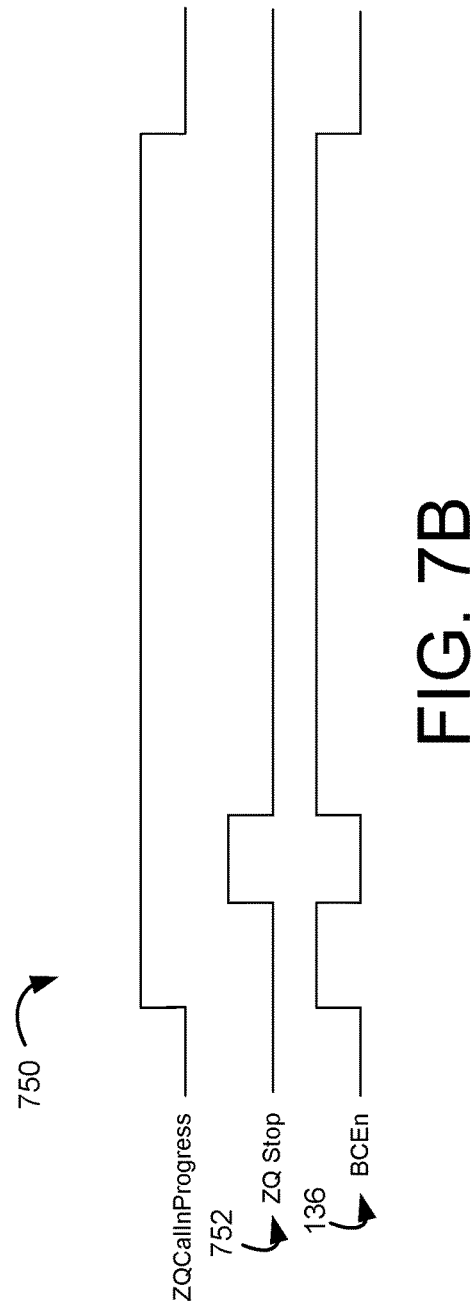

US 10,896,704 B2

APPARATUS WITH A CALIBRATION MECHANISM

CROSS-REFERENCE TO RELATED APPLICATION(S)

This application is a continuation of U.S. application Ser. No. 16/151,604, filed Oct. 4, 2018; which is incorporated herein by reference in its entirety.

TECHNICAL FIELD

The disclosed embodiments relate to apparatus such as memory devices, and, in particular, to memory devices with a calibration mechanism.

BACKGROUND

Memory systems can employ memory devices to store and access information. The memory devices can include volatile memory devices, non-volatile memory devices, or a combination device. Memory devices, such as dynamic random-access memory (DRAM), can utilize electrical energy to store and access data. Some memory devices can include vertically stacked dies (e.g., die stacks) that are connected using Through-Silicon-Vias (TSVs) in a master-slave (MS) configuration. For example, the memory devices can include Double Data Rate (DDR) RAM devices that implement DDR interfacing scheme for high-speed data transfer. The DDR RAM devices (e.g., DDR4 devices, DDR5 devices, etc.) can include memory chips that include die stacks that each include a master die and one or more slave dies.

Some memory device can include connection pads, TSVs, data lines, etc. that are dedicated for communication (e.g., for exchanging data, clock, etc.) between dies. Accordingly, various aspects (e.g., impedances, timing, signal levels, etc.) can be adjusted or calibrated to implement the communication between circuit components and/or dies.

With technological advancements in other areas and increasing applications, the market is continuously looking for faster and smaller devices. To meet the market demand, physical sizes or dimensions of the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

BRIEF DESCRIPTION OF THE DRAWINGS

FIG. 7A illustrates a timing diagram associated with starting a calibration process for the memory device of FIG. 1 in accordance with an embodiment of the present technology.

FIG. 7B illustrates a timing diagram associated with stopping a calibration process for the memory device of FIG. 1 in accordance with an embodiment of the present technology.

DETAILED DESCRIPTION

Figure 1:
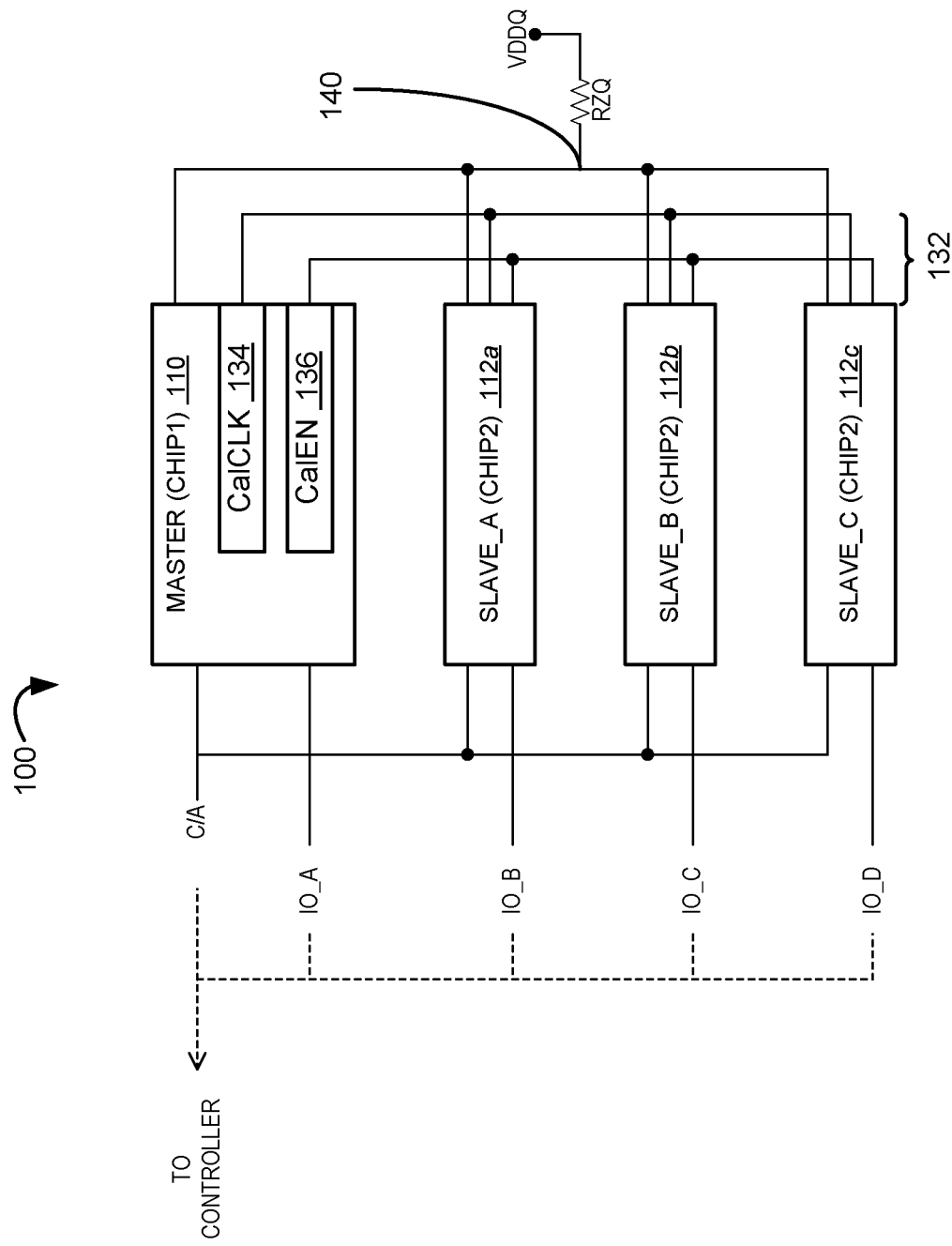
FIG. 1 illustrates a block diagram of a memory device in accordance with an embodiment of the present technology.

As described in greater detail below, the technology disclosed herein relates to an apparatus such as memory devices, systems with memory devices, and related methods for managing/facilitating a data source impedance (ZQ) calibration. The ZQ calibration can include a process that tunes the output drivers (e.g., drive strength) and/or on-die termination (ODT) values associated with one or more pads (e.g., DQ pads) configured to receive and/or supply input/output (I/O) power ($V_{DDQ}$) to other components (e.g., output transistors). For example, the ZQ calibration can access a ZQ pad, a ZQ resistor (RZQ), a voltage source (VDDQ), etc. to tune the drive strengths and the ODT values across changes in process, voltage, and/or temperature (PVT) that occur during operations of the memory devices.

Since multiple dies may share the same ZQ calibration pad, the dies can be configured to coordinate access such that only one die is using the pad at a time. In a multi-die memory device for a low power (LP) DDR5 specification, the master die (e.g., instead of an arbitration circuit for LPDDR4) can receive the ZQ calibration command and subsequently communicate the command to the slave die(s). Traditionally, to coordinate the timing, each of the dies in a package includes its own circuits (e.g., oscillators) for generating internal ZQ calibration clocks. However, the clock period can vary significantly between dies across different PVT. As such, the overall calibration time (tZQCal) must include excess time to account for the variations in the die-specific ZQ calibration clocks. As mentioned above, technological advancements and increasing applications are requiring faster processing, which increases the timing demand for the ZQ calibration process.

Instead of the traditional design, embodiments described below include a set of backchannels configured to communicate the calibration command from the master die to the slave die(s). For example, the embodiments can utilize two backchannel signals (e.g., a backchannel clock (BCClk) and a backchannel enable (BCEn)) to communicate commands. In addition to communicating the calibration command, the embodiments can utilize the backchannel signals to communicate/broadcast a common clock signal (e.g., BCClk) across all of the dies in the package. Each slave die can be preconfigured to implement the ZQ calibration after a predetermined number of clock cycles.

As a result, the memory devices described below can include one clock circuit in the master, thereby reducing the need/burden for the clock circuits in the slave dies and reducing the total number of clock circuits necessary for implementing the ZQ calibration process. Further, the common clock signal can reduce/eliminate the clock signal variations across the dies, thereby decreasing/eliminating the excess buffer time previously dedicated to harmonizing the differences in the clock signals. Also, the common clock signal can reduce/eliminate processing errors that may occur due to differences/variations in the die-specific clock signals.

FIG. 1 illustrates a block diagram of a memory device 100 (e.g., a semiconductor die assembly, including a 3DI device or a die-stacked package) in accordance with an embodiment of the present technology. For example, the memory device 100 can include a memory device, such as a DRAM (e.g., DDR4 DRAM, DDR5 DRAM, etc.), or a portion thereof that includes multiple dies/chips. In some embodiments, the memory device 100 can include a LPDRAM device, such as an LP5 device, and/or memory devices used in mobile-device applications.

The memory device 100 can include multiple semiconductor dies/chips that are electrically coupled to each other and to an external controller (e.g., a central processing unit (CPU), a host device, a system-on-chip controller, etc.). For example, the memory device 100 can include a master die 110 along with one or more slave dies (e.g., slave dies 112a through 112d). The master die 110 can coordinate one or more process between the dies and/or provide interactions or interface functions between the slave dies 112 and systems/devices external to the memory device 100. For example, the master die 110 can receive commands (e.g., a ZQ calibration command), data, address from the controller through a command/address bus (C/A). Also, the master die and the slave dies 112 can communicate various signals (e.g., data (DQ)) to/from the controller through corresponding input/output (I/O) busses.

In some embodiments, the memory device 100 can include a ZQ backchannel 132 (e.g., a set of dedicated inter-die connections) configured to communicate between dies one or more coordination signals associated with the ZQ calibration. Based on the coordination signals, the master die 110 and the slave dies 112 can sequentially access a ZQ connection 140 (e.g., a connection to a shared ZQ pad and/or RZQ) for the ZQ calibration process. For example, the memory device 100 can communicate a calibration enable 136, a calibration clock 134, etc., between the dies (e.g., from the master die 110 to one or more of the slave dies 112) using the ZQ backchannel 132. In at least one embodiment, the master die 110 can broadcast the calibration enable 136 and the calibration clock 134 to all of the slave dies 112.

Figure 2:
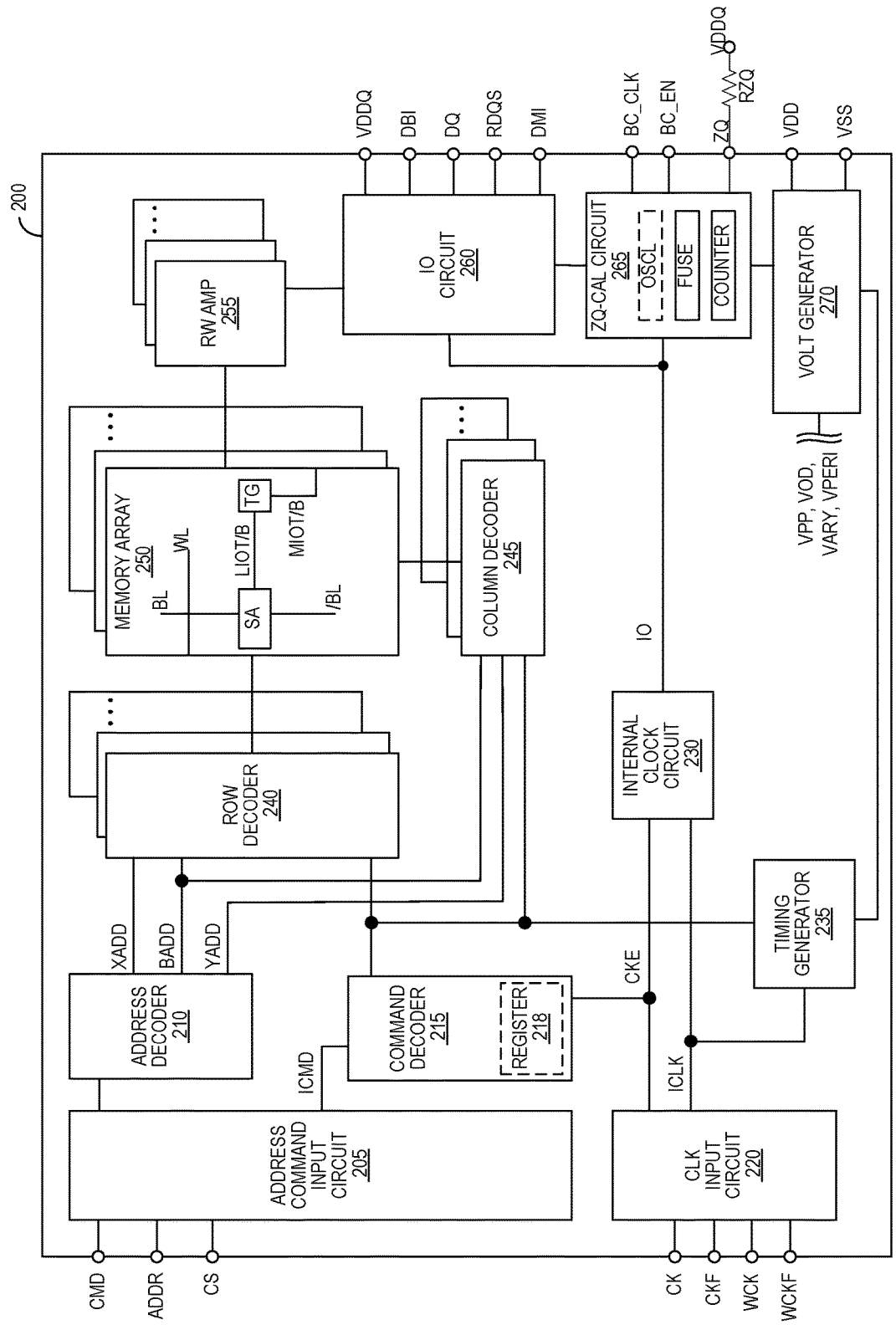
FIG. 2 illustrates a block diagram of a die in the memory device of FIG. 1 in accordance with an embodiment of the present technology.

FIG. 2 illustrates a block diagram of a die 200 (e.g., the master die 110 of FIG. 1, one or more of the slave dies 112 of FIG. 1, or a combination thereof) in the memory device 100 in accordance with an embodiment of the present technology. The die 200 may include an array of memory cells, such as memory array 250. The memory array 250 may include a plurality of banks (e.g., banks 0-15 in the example of FIG. 2), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SA) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The die 200 may employ a plurality of external terminals that include command and address terminals coupled to a command bus and an address bus to receive command signals (CMD) and address signals (ADDR), respectively. The memory device may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal (BADD) and supply the bank address signal to both the row decoder 240 and the column decoder 245.

The command and address terminals may be supplied with command signals (CMD), address signals (ADDR), and chip select signals (CS), from a memory controller. The command signals may represent various memory commands from the memory controller (e.g., including access commands, which can include read commands and write commands). The select signal may be used to select the die 200 to respond to commands and addresses provided to the command and address terminals. When an active chip select signal is provided to the die 200, the commands and addresses can be decoded and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 215 may further include one or more registers 217 for tracking various counts or values (e.g., counts of refresh commands received by the die 200 or self-refresh operations performed by the die 200).

When a read command is issued and a row address and a column address are timely supplied with the read command, read data can be read from memory cells in the memory array 250 designated by these row address and column address. The read command may be received by the command decoder 215, which can provide internal commands to input/output circuit 260 so that read data can be output from the data terminals DQ, RDQS, DBI, and DMI via read/write amplifiers 255 and the input/output circuit 260 according to the RDQS clock signals. The read data may be provided at a time defined by read latency information RL that can be programmed in the die 200, for example, in a mode register (not shown in FIG. 2). The read latency information RL can be defined in terms of clock cycles of the CK clock signal. For example, the read latency information RL can be a number of clock cycles of the CK signal after the read command is received by the die 200 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 215, which can provide internal commands to the input/output circuit 260 so that the write data can be received by data receivers in the input/output circuit 260, and supplied via the input/output circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the die 200, for example, in the mode register (not shown in FIG. 2). The write latency WL information can be defined in terms of clock cycles of the CK clock signal. For example, the write latency information WL can be a number of clock cycles of the CK signal after the write command is received by the die 200 when the associated write data is received.

The power supply terminals may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in the sense amplifiers included in the memory array 250, and the internal potential VPERI can be used in many other circuit blocks.

The power supply terminal may also be supplied with power supply potential VDDQ. The power supply potential VDDQ can be supplied to the input/output circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 260 so that power supply noise generated by the input/output circuit 260 does not propagate to the other circuit blocks.

In some embodiments, the die 200 can include a ZQ-calibration management circuit 265 (e.g., a set of digital and/or analog circuit components) configured to implement the ZQ calibration process. The ZQ-calibration management circuit 265 can be connected to the ZQ backchannel 132 of FIG. 1 to transmit, receive, and/or further process the ZQ calibration signals (e.g., the calibration clock 134 of FIG. 1, the calibration enable 136 of FIG. 1, etc.). For example, for the master die 110 of FIG. 1, the ZQ-calibration management circuit 265 can be configured to transmit the calibration clock 134 and further drive the calibration enable 136 according to the targeted state and/or type of calibration (e.g., a background calibration or a command calibration).

The ZQ-calibration management circuit 265 can include a fuse/register that stores information (e.g., a threshold amount/duration) associated with a timing/sequence for the corresponding die to access the ZQ connection 140 of FIG. 1. The ZQ-calibration management circuit 265 can further include a counter configured to count the number of clock cycles of the calibration clock 134 and trigger a calibration circuit (not shown) when the number of clock cycles matches the threshold amount/duration stored in the fuse/register. Based on trigger, the calibration circuit of the die 200 can connect to the ZQ connection 140 and generate an impedance code. The calibration circuit can further include a pull-up leg and a pull-down leg. The calibration circuit can generate the impedance code based on connecting the pull-down leg (thereby pulling down VZQ at the calibration channel) and/or the pull-up leg (thereby pulling up VZQ at the calibration channel) to the ZQ connection 140. The calibration circuit can generate the impedance code according to the pulled-down VZQ and/or the pull-up VZQ, and then pass the impedance code to the input/output circuit 260 for adjusting an output buffer (not shown) therein. For the master die 110, the ZQ-calibration management circuit 265 can additionally include an oscillator that has been enabled to generate the calibration clock 134. Further details regarding the ZQ-calibration management circuit 265 is described below.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a CKE signal from the command decoder 215, an input buffer can receive the CK and CKF signals and the WCK and WCKF signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signal based on the received internal clock signals ICLK and a clock enable signal CKE from the command/address input circuit 205. For example, the internal clock circuit 230 can include a clock path (not shown in FIG. 2) that receives the internal clock signal ICLK and provides various clock signals to the command decoder 215. The internal clock circuit 230 can further provide input/output (IO) clock signals. The IO clock signals can be supplied to the input/output circuit 260 and can be used as a timing signal for determining an output timing of read data and the input timing of write data. The IO clock signals can be provided at multiple clock frequencies so that data can be output from and input to the die 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated.

The die 200 can be connected to any one of a number of electronic devices capable of utilizing memory for the temporary or persistent storage of information, or a component thereof. For example, a host device of die 200 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to die 200, although in other embodiments, the host device may be indirectly connected to memory device (e.g., over a networked connection or through intermediary devices).

Figure 3:
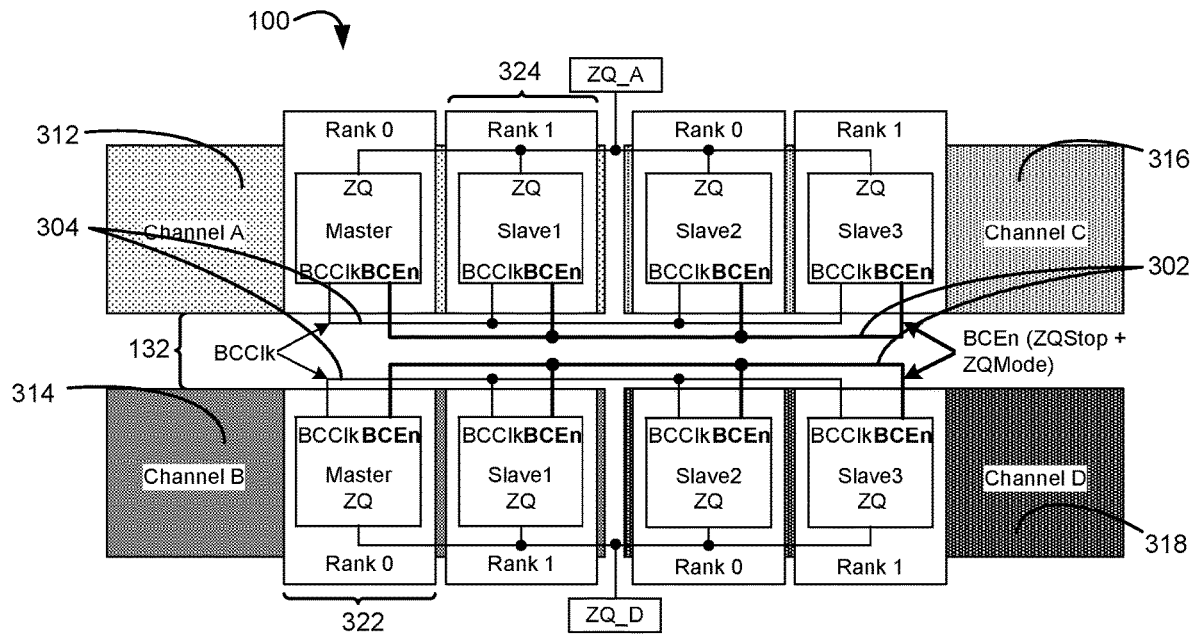
FIG. 3 illustrates a block diagram of a ZQ coordination channel of the memory device in accordance with an embodiment of the present technology.

FIG. 3 illustrates a block diagram of a ZQ coordination channel (e.g., the ZQ backchannel 132) of the memory device 100 in accordance with an embodiment of the present technology. Multiple (e.g., up to 16 or more) dies can share the same ZQ calibration pad. The ZQ backchannel 132 can be used to communicate the ZQ calibration signals for providing non-overlapping access to ZQ pads/resistors for the dies in the memory device 100. Accordingly, the ZQ backchannel 132 can connect to the dies across channels, ranks, dies, etc. and enable communication of one or more coordination signals to/from the dies. For example, the ZQ backchannel 132 can include a clock connection 304 and an enable connection 302 that connect the master die 110 to the slave dies 112 of FIG. 1 (e.g., a first slave die, a second slave die, a third slave die, etc.). The clock connection 304 can be configured to communicate the calibration clock 134 of FIG. 1 between the dies, and the enable connection 302 can be configured to communicate the calibration enable 136 of FIG. 1 between the dies.

Figure 4:
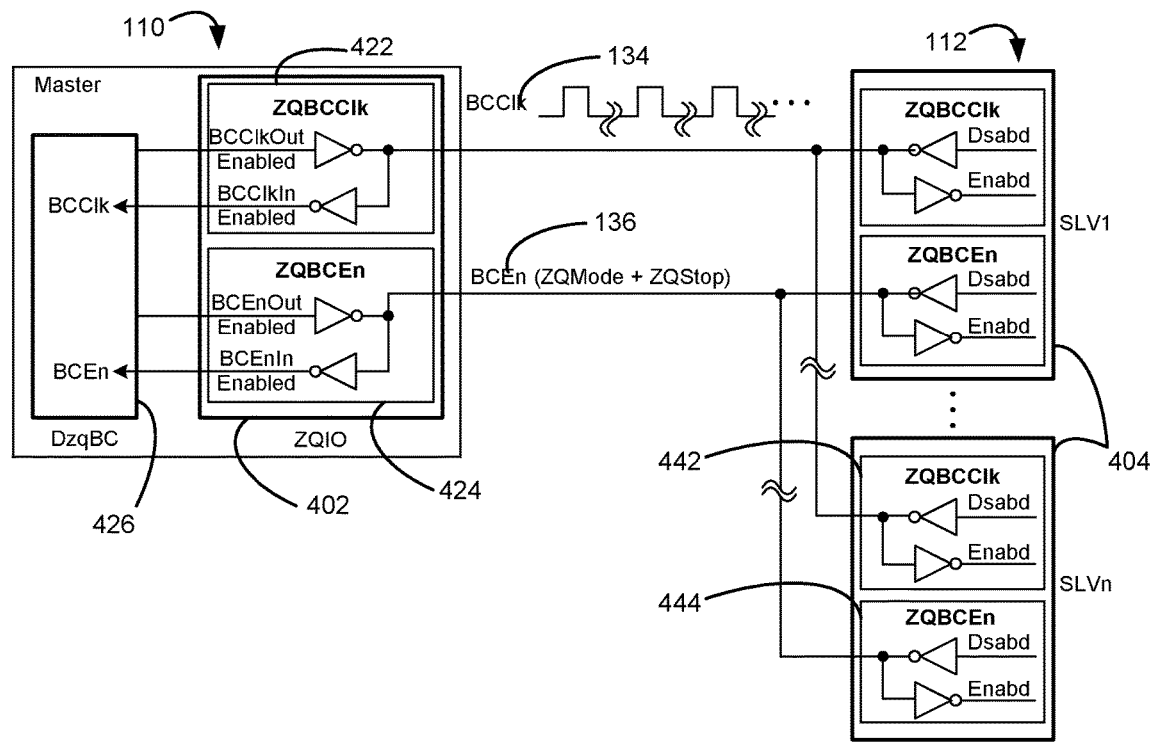
FIG. 4 illustrates an example circuit diagram of the calibration channel in accordance with an embodiment of the present technology.

FIG. 4 illustrates an example circuit diagram of the calibration channel in accordance with an embodiment of the present technology. In some embodiments, the calibration channel can include a backchannel driver 402 at the master die 110 of FIG. 1 and a backchannel receiver 404 at each of the slave dies 112 of FIG. 1. The backchannel driver 402 can include a clock driver 422 configured to generate/send the calibration clock 134 of FIG. 1 and an enable driver 424 configured to generate/send the calibration enable 136 of FIG. 1. The master die 110 can further include a backchannel control circuit (e.g., logic) 426 configured to control the ZQ calibration signals. For example, the backchannel control circuit 426 can include the oscillator for generating the calibration clock 134. Also, the backchannel control circuit 426 can include logic configured to control states of the calibration enable 136, such as for communicating a ZQ calibration start signal, such as for starting a background calibration or a command calibration, and a ZQ calibration stop signal. In some embodiments, the backchannel control circuit 426 can receive a feedback of the calibration clock 134 and the calibration enable 136 from the backchannel driver 402.

The backchannel receiver 404 can be configured to receive the ZQ calibration signals at the corresponding slave die. For example, the backchannel receiver 404 can include a clock receiver 442 configured to receive the calibration clock 134 and an enable receiver 444 configured to receive the calibration enable 136.

The pads for the enable connection 302 of FIG. 3 and/or the clock connection 304 of FIG. 3 can be located anywhere on the die. In some embodiments, the backchannel control circuit 426 can be located relatively near the backchannel driver 402. In some embodiments, the backchannel control circuit 426 can be located on the master die 110 independent of the location or distance from the backchannel driver 402. In some embodiments, the supply for the full CMOS output buffer (e.g., the backchannel driver 402) can be $V_{dd2}$. In some embodiments, the input buffer can be a CMOS inverter similar to CKE, which can be tied to $V_{dd2}$.

Figure 5:
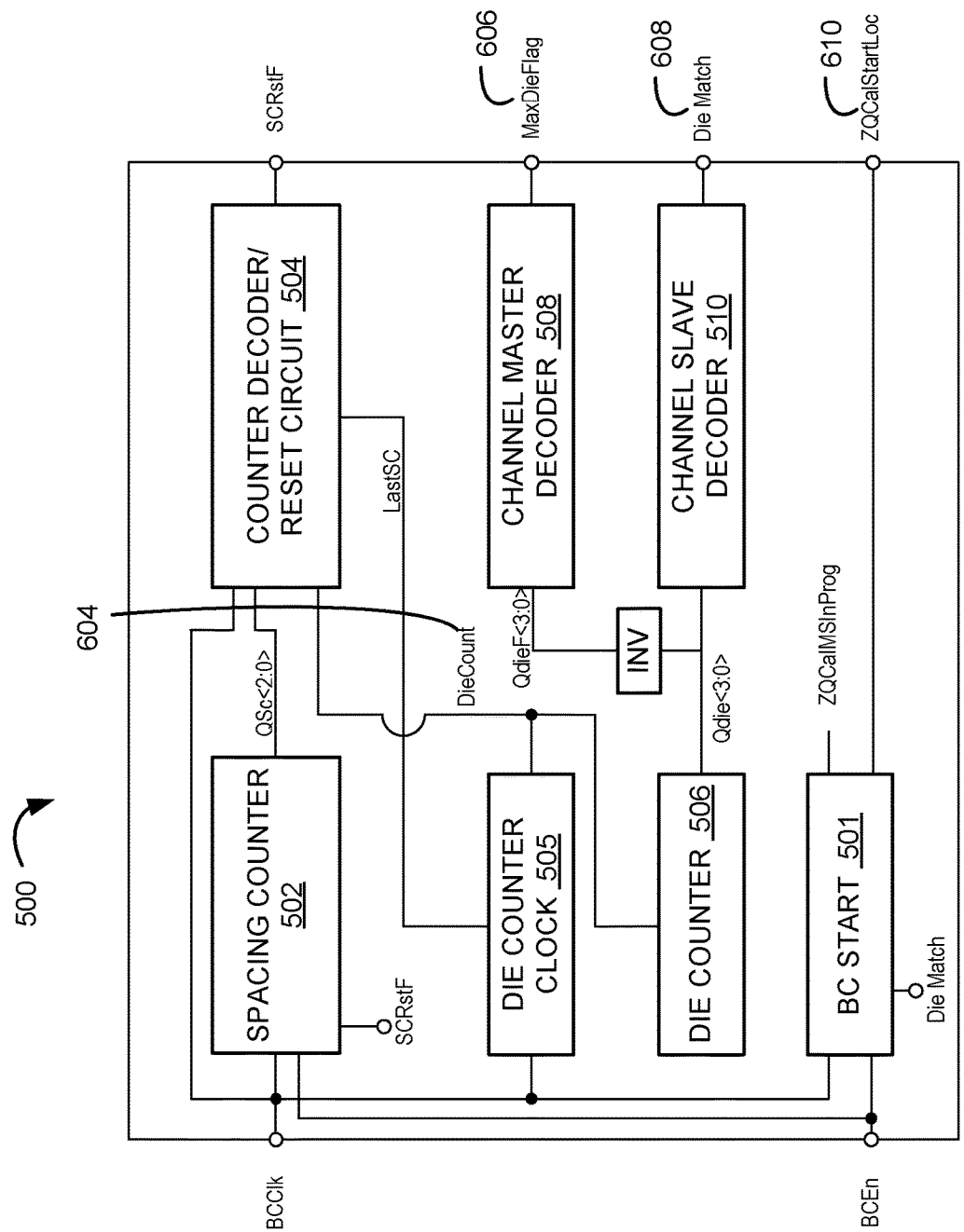
FIG. 5 illustrates a block diagram of a channel management circuit in accordance with an embodiment of the present technology.
Figure 6:
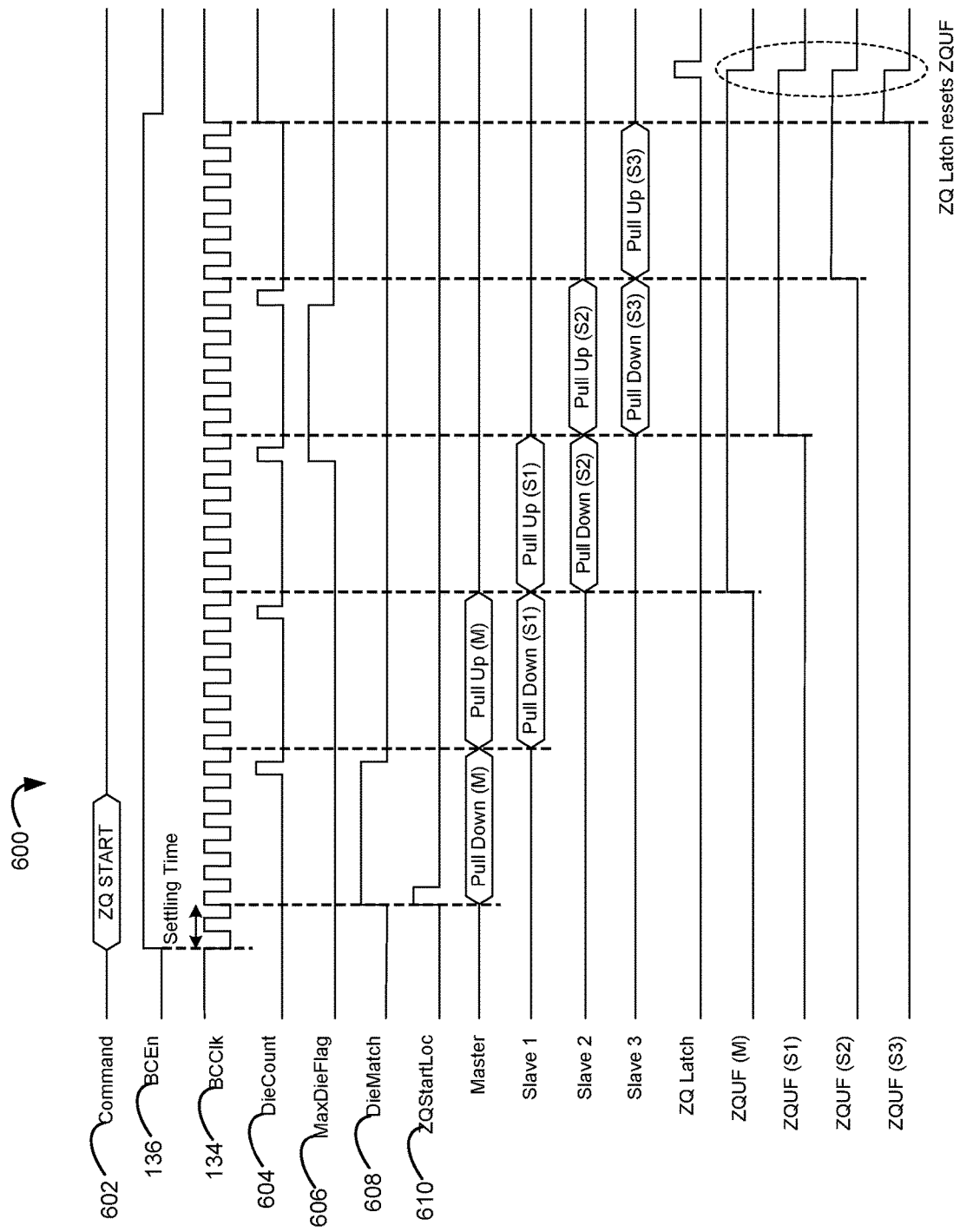
FIG. 6 illustrates a timing diagram for the memory device of FIG. 1 in accordance with an embodiment of the present technology.

FIG. 5 and FIG. 6 illustrate an example of a channel management circuit coordinating the ZQ calibration process across (e.g., sequentially one after another) multiple chips (e.g., the master die and the slave dies). FIG. 5 illustrates a block diagram of a channel management circuit 500 (e.g., the ZQ-calibration management circuit 265 of FIG. 2, the ZQ backchannel 132 of FIG. 1, a portion thereof, or a combination thereof) in accordance with an embodiment of the present technology. FIG. 6 illustrates a timing diagram 600 for the memory device 100 of FIG. 1 (e.g., the master die 110 of FIG. 1 and/or the slave dies 112 of FIG. 1) in accordance with an embodiment of the present technology. For example, the timing diagram 600 can illustrate a sequence and timing of signal/state transitions and operations associated with the ZQ calibration process (e.g., the calibration signals) across multiple dies (e.g., 4 dies, one master die and three slave dies).

In some embodiments, the calibration management circuit 500 can be included in the master die 110 of FIG. 1, one or more of the slave dies 112 of FIG. 1, the ZQ backchannel 132, or a combination thereof. In some embodiments, the calibration management circuit 500 can include a channel start block 501, a spacing counter 502, a counter control (decoder/reset) circuit 504, a die counter clock 505, a die counter 506, a channel master decoder 508, a channel slave decoder 510, etc.

For example, the master die 110 can include the channel management circuit 500 that manages the ZQ calibration according to the timing diagram 600. Each of the slave dies can include all or one or more portions of the channel management circuit 500, such as the channel start block 501, the spacing counter 502, the counter control circuit 504, the die counter clock 505, the die counter 506, the channel slave decoder 510, etc.

The ZQ calibration process can begin based on a ZQ command 602. The ZQ command 602 can be generated (e.g., by the master die 110 of FIG. 1, the controller, etc.) based on a predetermined interval (e.g., for regularly occurring background calibration processes). The ZQ command 602 can be generated based on receiving and/or decoding a command, such as from an external device (e.g., the controller), for executing a commanded calibration process.

The memory device 100 (e.g., the ZQ-calibration management circuit 265 for the master die 110) can generate the calibration enable 136 of FIG. 1, such as by transitioning the state/level (e.g., from low to high), based on the ZQ command 602. For example, the master die 110 can transition the state/level of the calibration enable 136 when the ZQ command 602 is generated, decoded, etc. Similarly, the memory device 100 (e.g., the ZQ-calibration management circuit 265 of FIG. 2 for the master die 110) can generate the calibration clock 134 of FIG. 1, such as by regularly transitioning levels/states of the output according to set intervals, based on the ZQ command 602. For example, the master die 110 can begin or resume toggling the state (e.g., using the oscillator therein) of the calibration clock 134 when the ZQ command 602 is generated, decoded, etc.

The channel management circuit 500 can receive the calibration clock 134 (BCClk) and/or the calibration enable 136 (BCEn), such as at the channel start block 501, the spacing counter 502, the counter control circuit 504, the die counter clock 505, etc. Based on receiving the calibration clock 134 and the calibration enable 136 of FIG. 1, the channel start block 501 can generate the internal enable signal (ZQCalMSInProg) that represents an ongoing status for the ZQ calibration process across the multiple dies. For example, the channel start block 501 can set the internal enable signal high when any die in the memory device 100 is performing the ZQ calibration, such as when the calibration enable 136 is high.

In some embodiments, for the master die 110, the channel start block 501 can directly generate (e.g., based on bypassing other circuits described below) a local start signal (ZQCalStartLoc) 610 to access the ZQ connection and perform the ZQ calibration thereon. The local start signal 610 can initiate a corresponding die to start the calibration process and access the ZQ connections. In other embodiments, the channel start block 501 of the master die 110 can generate the local start signal 610 based on results from other circuits, similar to other slave dies.

The spacing counter 502 can include logic configured to coordinate access of the ZQ resistor for each die (e.g., between the master die 110 and/or the slave dies 112). For example, the spacing counter 502 can track the number of cycles of the calibration clock 134 for each die accessing the ZQ resistor. The spacing counter 502 can generate an indication of the current compare cycle (QSc<2:0>) based on counting the calibration clock 134. In some embodiments, the calibration management circuit 500 can include a predetermined sequence and/or timing (e.g., information stored on a fuse on each of the dies) for the dies to access the ZQ resistor, and the dies can access the ZQ resistor after a predetermined duration/number of clock cycles. Accordingly, the spacing counter 502 can count the number of clocks for allowing each die to access the ZQ resistor (e.g., the pull-down leg).

The counter control circuit 504 can include logic configured to determine a timing associated with the die-access for the ZQ resistor. The counter control circuit 504 can receive the QSc<2:0>, the calibration clock 134, a die count (DieCount) 604, etc. for determining the timing. The counter control circuit 504 can generate a setting signal (SCRstF, not shown in FIG. 6) that manages the counting operation. In some embodiments, the counter control circuit 504 can be asserted low past 1st cycle to allow a settling time for executing the ZQ calibration process. In some embodiments, the counter control circuit 504 can control (e.g., a pulse) the setting signal to reset the spacing counter 504, such as when the die count 604 fires. For managing the counting operation, the counter control circuit 504 can generate a last count signal (LastSC) that represents the last clock cycle for the currently accessing die. The last count signal can be processed by other circuits to implement one or more portions (e.g., last portions of accessing the pull-down leg, transitioning between pull-down leg and the pull-up leg, transitioning between chips, etc.) of the chip-local ZQ calibration.

For example, the last count signal can be used, such as at the the die counter clock 505, to fire the die count 604 on the next clock cycle. The die counter clock 505 can include logic configured to generate an internal clock (e.g., the die count 604) used to signal a corresponding die to access the ZQ connection. The die counter 505 can generate the internal clock based on the calibration clock 134 and/or the last count signal. The die counter can send the die count 604 to the counter control circuit 504, such as for resetting the counters, and/or to the die counter 506.

The die counter 506 can include logic configured to track the accessing die according to the predetermined sequence. For example, the die counter 506 can include logic that determines that the master die (e.g., 0th die) is accessing the ZQ resistor (e.g., the pulldown leg) when one or more enable signals are active and the last count signal and/or the die counter 506 has not fired. The die counter 506 can determine that the first slave die (e.g., 1st die) is accessing the ZQ resistor after the first firing of the last count signal and/or the die counter 506, that the second slave die (e.g., the 2nd die) is accessing after the second firing, etc. The die counter 506 can track the internal clock to generate a die identifier (QDie<3:0>, not shown in FIG. 6) that identifies which die (e.g., 0th die, the 1st die, etc.) is currently access the ZQ resistor (e.g., the pulldown leg). The die identifier can be passed to the channel master decoder 508 and/or the channel slave decoder 510. The calibration management circuit 500 can use the die identifier and the internal clock to end access to the ZQ connection for the current die and coordinate access for the next die.

The channel master decoder 508 (e.g., at the master die 110) can include logic configured to generate a max-die flag (MaxDieFlag) 606 representing that last die in the sequence or the system is performing the ZQ calibration process. The channel master decoder 508 can use the die identifier or an inverse thereof (QDieF<3:0>) to generate the max-die flag 606. The memory device 100 can use the max-die flag 606 to finish the overall ZQ calibration process and implement other associated processes.

The channel slave decoder 510 (e.g., at the slave dies 112) can include logic configured to indicate if a corresponding die should access the ZQ resistor according to the die identifier. The channel slave decoder 510 can generate a die match signal (DieMatch) 608 when the die identifier matches the identification information of the corresponding die. For example, the channel slave decoder 510 for the 1st slave die can generate the die match signal 608 when the die identifier matches the identifier for the 1st slave die. The die match signal 608 can be used (e.g., at the channel start block 501) to generate the local start signal 610 for the corresponding die. The local start signal 610 can initiate the corresponding die to access the ZQ resistor (e.g., for the pulldown leg) and implement/execute the ZQ calibration process thereon.

In some embodiments, the channel start block 501 and/or the ZQ-calibration management circuit 265 for the master die 110 can generate the local start signal 610 (e.g., a pulse) for the master die 110 to access the ZQ connection and perform the ZQ calibration thereon. The master die 110 can generate the local start signal 610 based on the calibration clock 134 and/or the calibration enable 136 (e.g., without the die match signal 608 and/or other processing results). In some embodiments, the channel start block 501 and/or the ZQ-calibration management circuit 265 for the master die 110 can generate the local start signal 610 based on counting the clock pulses, identifying the matching die, etc.

According to the local start signal 610 at the master die 100, the master die 110 can access the pull-down leg of the ZQ connection for a predetermined period (e.g., six clock cycles) as illustrated in FIG. 6. At the end of the predetermined period, the master die can access the pull-up leg, and a subsequent die (e.g., the 1st slave die) can access the pull-down leg. For example, the spacing counter 502, the counter control circuit 504, etc. on the master die 110 and/or the 1st slave die can track the predetermined period. As the predetermined period lapses, the counter control circuit 504 can generate the last count signal. When the predetermined period ends, the die counter clock 505 can generate a pulse (e.g., the die count 604), increment the die identifier using the die counter 506, etc. Accordingly, as the memory device 100 generates the die count pulse 604, the currently accessing die (e.g., the master die 110) can release the pull-down leg, and the die counter 506 can update the die identifier. After the die count pulse 604, the die match 608, the local start signal 610, etc. can be issued for the next subsequent die (e.g., the first slave die).

Each of the dies and/or the calibration management circuit 500 can include a set of fuses and counters configured to ensure sequential access of the ZQ connection (e.g., the ZQ resistor/pad) for the dies. The fuses can be predetermined/programmed to store a unique number of clock cycles and/or the die identifiers that correspond to the sequential access by the dies. For example, the counter control circuit 504 can include a fuse predetermined/programmed to store the predetermined period for accessing the ZQ resistor for each die. Also, the channel slave decoder 510 can include a predetermined/programmed identifier for the corresponding die, which the channel slave decoder 510 can use to generate the die match 608.

For the four die (e.g., one master die and three slave dies) example illustrated in FIG. 6, the memory device 100 be configured to wait a predetermined set up time (e.g., 1 clock cycle) to set/initialize the ZQ-calibration management circuit 265 and/or the channel management circuit 500. Accordingly, the master die 110 can activate the pull-down leg/path and maintain such state for the predetermined number of clock cycles for the ZQ calibration process. The fuse and the counter for the first slave die can be configured to trigger access the ZQ pad/resistor after 7 cycles of the calibration clock 134 and/or 1 cycle of the die count 604. Accordingly, the first slave die can activate the pull-down leg/path and maintain such state for a predetermined number of additional clock cycles. At the same time, the master die 110 can also activate the pull-up leg while the first slave die activates the pull-down leg. Similarly, the second slave die can activate the pull-down leg after 13 cycles of the calibration clock 134 and/or 2 cycles of the die count 604, and the third slave die can activate the pull-down leg after 19 cycles of the calibration clock 134 and/or 3 cycles of the die count 604. Also, the preceding die can activate the pull-up leg while the preceding die activates the pull-down leg.

As last of the slave dies (e.g., the third slave die as illustrated in FIG. 6) accesses the ZQ resistor, the memory device 100 (e.g., the channel master decoder 508 of FIG. 5) can generate a max-die flag (MaxDieFlag) 606 as an indication that the last of the dies are accessing the ZQ resistor. The calibration management circuit 500 can receive a ZQ latch from an external device at any time during the ZQ calibration process, including after all of the dies access the ZQ resistor. For example, the ZQ latch can be received after the last of the slave dies (e.g., the third slave die of FIG. 6) accesses the pull-down leg and the pull-up leg. The ZQ latch can reset a ZQ update flag (ZQUF) for the master die 110 and/or the slave dies 112.

The memory device 100 (e.g., the master die 110) can stop the ZQ calibration process at any time based on turning off/disabling the calibration enable 136. When the calibration enable 136 turns off, the accessing die can disconnect from the ZQ connection, and all of the dies can reset the counters.

For illustrative purposes, the master die 110 is described as accessing the ZQ pad/resistor before the slave dies. However, it is understood that the master die 110 can access the ZQ pad/resistor after the slave dies or between sets of slave dies. Also for illustrative purposes, such as for LPDDR, the dies are described as accessing the pull-down leg before accessing the pull-up leg. However, it is understood that the dies can access the pull-up leg before the pull-down legs, such as for commodity parts. Further, the dies can use any number of clock cycles (e.g., other than the 1 cycle for setting/initialization and regular periods marked by 7 clock cycles/1 die count pulse) to trigger the access. Further, it is understood that the memory device 100 can include a different number of dies, such as less than four dies or more than four dies.

FIG. 7A illustrates a timing diagram 700 associated with starting a calibration process for the memory device 100 of FIG. 1 in accordance with an embodiment of the present technology. The memory device 100 (e.g., the master die 110 of FIG. 1) can initiate the calibration process based on adjusting/generating the calibration enable 136 of FIG. 1. For example, the ZQ-calibration management circuit 265 of FIG. 2 of the master die 110 can drive or set the calibration enable 136 high to initiate the calibration process.

In some embodiments, the memory device 100 can control a relative timing between the calibration clock 134 of FIG. 1 and the calibration enable 136 to initiate a background calibration process (e.g., a regularly scheduled ZQ calibration process) or a command calibration process (e.g., a specifically commanded instance of the ZQ calibration process that is outside of the regular schedule). The memory device 100 can differentiate between a background calibration start 702 and a command calibration start 704 based on driving the calibration clock 134 high or low for the resting state before setting the calibration enable 136. Accordingly, the memory device 100 can issue/generate the background calibration start 702 or the command calibration start 704 based on setting the calibration enable 136 when the calibration clock 134 is high or low.

For example, as illustrated in FIG. 7A, the master die 110 can generate/issue the background calibration start 702 by setting the calibration clock 134 high during the resting period (e.g., before setting the calibration enable 136) and then setting the calibration enable 136 high with the calibration clock 134 starting from a high state. Also, the master die 110 can generate/issue the command calibration start 704 by setting the calibration clock 134 low during the resting period and then setting the calibration enable 136 high with the calibration clock 134 starting from a low state. In response, the slave dies 112 can determine the level/state of the calibration clock 134 when the calibration enable 136 transitions high and initiate the corresponding process accordingly.

FIG. 7B illustrates a timing diagram 750 associated with stopping a calibration process for the memory device 100 of FIG. 1 in accordance with an embodiment of the present technology. The memory device 100 (e.g., the master die 110 of FIG. 1) can stop or pause the calibration process based on adjusting/generating the calibration enable 136. For example, the ZQ-calibration management circuit 265 of FIG. 2 of the master die 110 can drive or set the calibration enable 136 low to stop or pause the calibration process.

The master die 110 can determine a stop condition, such as based on detecting an interrupt condition associated with a different process, receiving a separate stop command, determining a change in state, etc. The master die 110 can set or latch a ZQ stop (e.g., a status bit) 752 local thereto based on determining the stop condition. According to the ZQ stop 752, the master die 110 can further remove (e.g., set to low) the calibration enable 136. When the slave dies 112 determine the removal of the calibration enable 136, the slave dies 112 can reset the ZQ calibration settings, progress, status, etc. and/or set its own local instance of the ZQ stop.

The master die 110 can similarly determine a start condition, such as based on detecting removal of the stop condition, receiving a separate start command, waiting a predetermined period, etc. The master die 110 can remove the ZQ stop 752 and automatically start the ZQ calibration process. The memory device 100 (e.g., the ZQ-calibration management circuit 265, the ZQ backchannel 132 of FIG. 3, etc.) can be configured to remove the ZQ stop on the slave dies 112 within a predetermined time (e.g., within 100 ns for LP5) from removal of the ZQ stop 752 on the master die 110.

Figure 8:
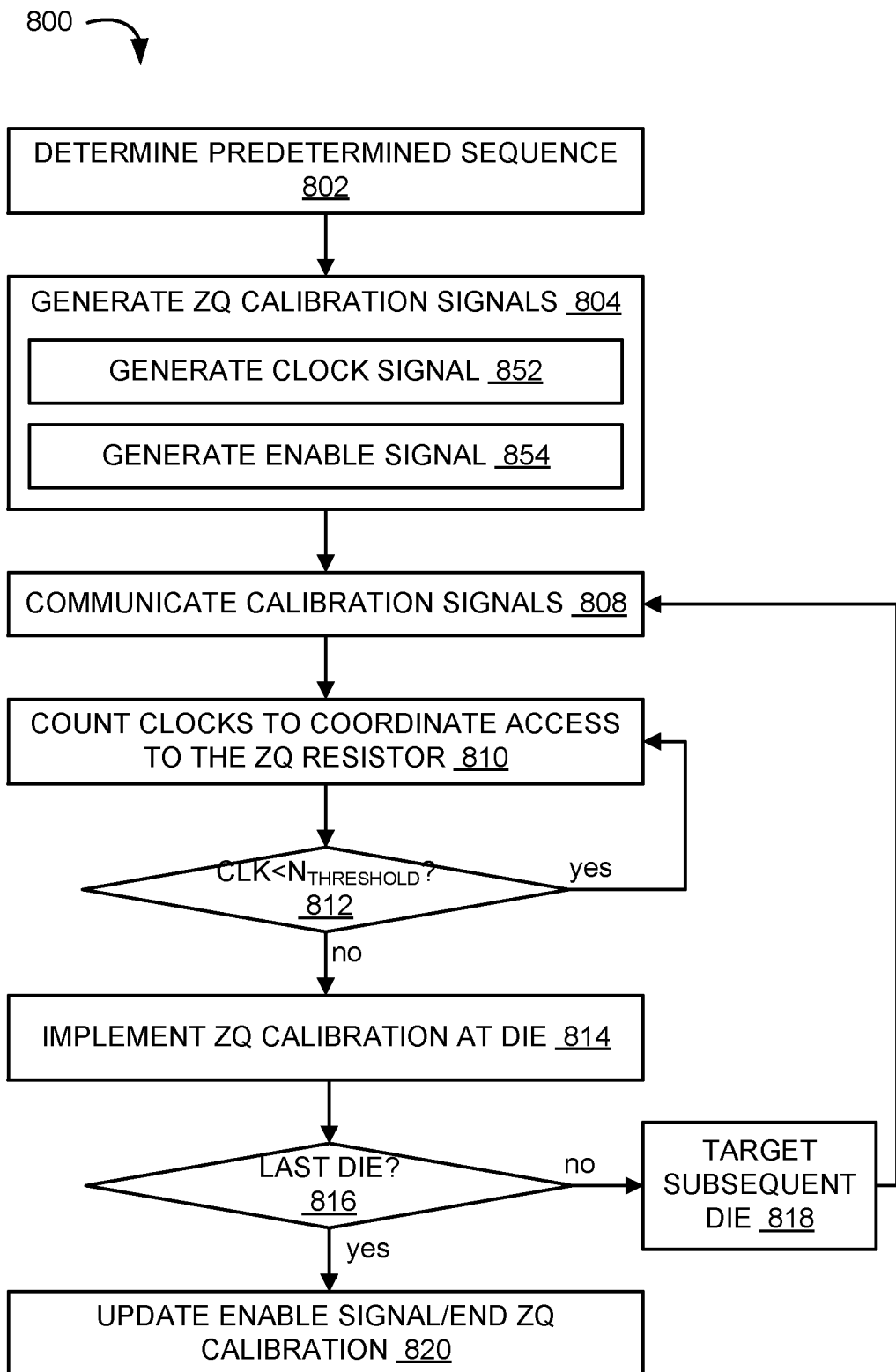
FIG. 8 is a flow diagram illustrating an example method of operating the memory device of FIG. 1 in accordance with an embodiment of the present technology.

FIG. 8 is a flow diagram illustrating an example method 800 of operating the memory device 100 of FIG. 1 in accordance with an embodiment of the present technology. The method 800 can be for operating the ZQ-calibration management circuit 265 of FIG. 2, the calibration management circuit 500 of FIG. 5, the calibration channel 132 of FIG. 1. The method 800 can be for implementing the ZQ calibration process across multiple dies (e.g., the master die 110 and the slave dies 112, all of FIG. 1). The method 800 can include generating and responding to the ZQ calibration signals. The method 800 can correspond to the timing diagram 600 of FIG. 6.

At block 802, the memory device 100 can determine a sequence of the dies for accessing the ZQ connection (e.g., the ZQ resistor/pad). For example, the master die 110 and/or the slave dies 112 can access/read a fuse thereon to determine a number (e.g., a threshold) unique for each die. The stored number can further correspond to a sequence for the dies (e.g., the master die 110 and the slave dies 112) to access the ZQ connection (e.g., the pull-down leg and/or the pull-up leg). For example, the number stored on the fuse can represent a threshold number of inputs, such as a number of cycles for the calibration clock 134 of FIG. 1 and/or a number of pulses for the die count 604 of FIG. 6.

At block 804, the memory device 100 can generate calibration signals for implementing the ZQ calibration process. The master die 110 can determine the start condition, as discussed above, and generate (e.g., set to high/low or toggle) the calibration signals, such as the calibration clock 134, the calibration enable 136 of FIG. 1, etc. For example, at block 852, the master die 110 can generate the calibration clock 134, such as by initially setting the signal high/low before enable and/or toggling the signal after enable. Also, at block 854, the master die 110 can generate or set (e.g., from low to high) an enable signal (e.g., the calibration enable 136) to start the ZQ calibration process.

As discussed above, the master die 110 can issue either the background calibration start 702 of FIG. 7A or the command calibration start 704 of FIG. 7A based on initializing the calibration clock signal (e.g., the calibration clock 134 and/or the die count 604) to a predetermined level (e.g., either high or low state) corresponding to the background calibration start 702 or the command calibration start 704 before generating/setting the calibration enable 136. With the initialized clock signal, the master die can generate/set the calibration enable 136 to generate/issue the background calibration start 702 or the command calibration start 704. After setting the calibration enable 136, the master die 110 can toggle the calibration clock signal as described above, such as in FIG. 7A. As illustrated in block 808, the generated/set signals can be communicated between the dies, such as from the master die 110 to the slave dies 112 through the ZQ backchannel 132 of FIG. 1 (e.g., the enable connection 302 of FIG. 3, the clock connection 304 of FIG. 3, etc.).

At block 810, the memory device 100 can count clocks/transitions in the calibration clock to coordinate access of the dies to the ZQ pad/resistor. For example, each of the dies and/or the channel management circuit 500 can use a counter circuit therein to count the cycles or transitions in the calibration clock. At block 812, the each of the dies (e.g., the ZQ-calibration management circuit 265 therein) and/or the channel management circuit 500 can compare the number of clock cycles to the predetermined threshold stored in the fuse. The dies/management circuit can continuously count the clocks until the number of cycles/transitions satisfy/match the threshold unique to each die.

At block 814, the memory device 100 can implement the ZQ calibration at the dies when the cycle/transition satisfies at the die satisfies its unique threshold. When the number of cycle/transition satisfies or matches the unique threshold, the corresponding die (e.g., the master die 110 and each of the slave dies 112 at different times) can trigger and implement the ZQ calibration process or a portion therein, such as by accessing the pull-down leg and/or the pull-up leg of the ZQ connection. According to the unique thresholds, the dies can use the broadcasted calibration clock signal to access the ZQ connection according to a predetermined access sequence.

For example, as illustrated in FIG. 6, the master die 110 can be configured (e.g., through the value stored in the fuse thereon) to wait one clock cycle after the calibration enable 136 transitions high and then access the pull-down leg. The each of the slave dies can be configured to wait a different duration (e.g., a predetermined number, such as six, of clock cycles and/or an additional die count pulse etc.) after the calibration enable 136 transitions high to access the ZQ connection. Accordingly, the channel management circuit 500 can generate the die match 608 to indicate that the ZQ connection is being accessed by the corresponding die. To determine the timing, the channel management circuit 500 and/or the dies can count the transitions in the calibration clock signal and generate/set the die count pulse 604. According to the timing, the dies can access and then release pull-down leg and the pull-up leg of the ZQ connection.

At block 816, the memory device 100 (e.g., the master die 110 and/or the channel management circuit 500) can determine whether the current die accessing the ZQ connection is the last die in the sequence. For example, the channel management circuit 500 can track the die count 604 to determine whether the current die is the last die in the sequence. At block 818, when the current die finishes accessing the ZQ connection or a portion thereof (e.g., 6 cycles for the pull-down leg and another 6 cycles for the pull-up leg) the memory device 100 can target the subsequent die for the calibration process and ZQ connection access. The currently accessing die can release or disconnect from the pull-down leg, and/or access the pull-up leg after the predetermined period. Also, the subsequent die in sequence can access the pull-down leg, and the master die 110 can update the die match 608 accordingly. The memory device 100 repeat the processes illustrated at boxes 808-816 and described above until the current accessing die is the last die in the sequence.

At block 820, when the last die finishes the calibration process, the memory device 100 can end the ZQ calibration process. For example, after last die finishes its calibration routing, including accessing the pull-up leg and the pull-down leg, the master die 110 can reset the max-die flag 606 of FIG. 6 (e.g., that was set when the ZQ calibration process began at the last die), setting the calibration latch, resetting the die-specific status information, removing/disabling the calibration enable 136, etc.

The master die 110 generating the calibration signals (e.g., the clock signal and the enable signal) reduces the amount of variation between ZQ calibration timing in a multi-die package (e.g., LP5 multi-die package). The master die 110 can provide the clock as well as enable signals to the slave dies 112, thereby requiring any need for independent oscillators/timing generators at the slave dies. The calibration signals can be used for ZQ arbitration between dies, and each die will count the clocks and wait for its turn before beginning the ZQ calibration at the die. Using the calibration signals broadcasted by the master die 110 to coordinate the ZQ arbitration and removing separate oscillators at the slave dies further removes possibility of deviations in multiple clock signals that occur across PVT variation. Further, the timing buffer that accounts for the variations across different clocks at different dies can further be removed, thereby improving the integration time/noise immunity within the limited time allotted for the ZQ calibration (e.g., 1.5 us for 4 dies in LP5). Accordingly, the master die 110 generating the calibration signals and coordinating timing of the ZQ access can reduce processing errors and/or improve device reliability by reducing differences in multiple clock signals.

Figure 9:
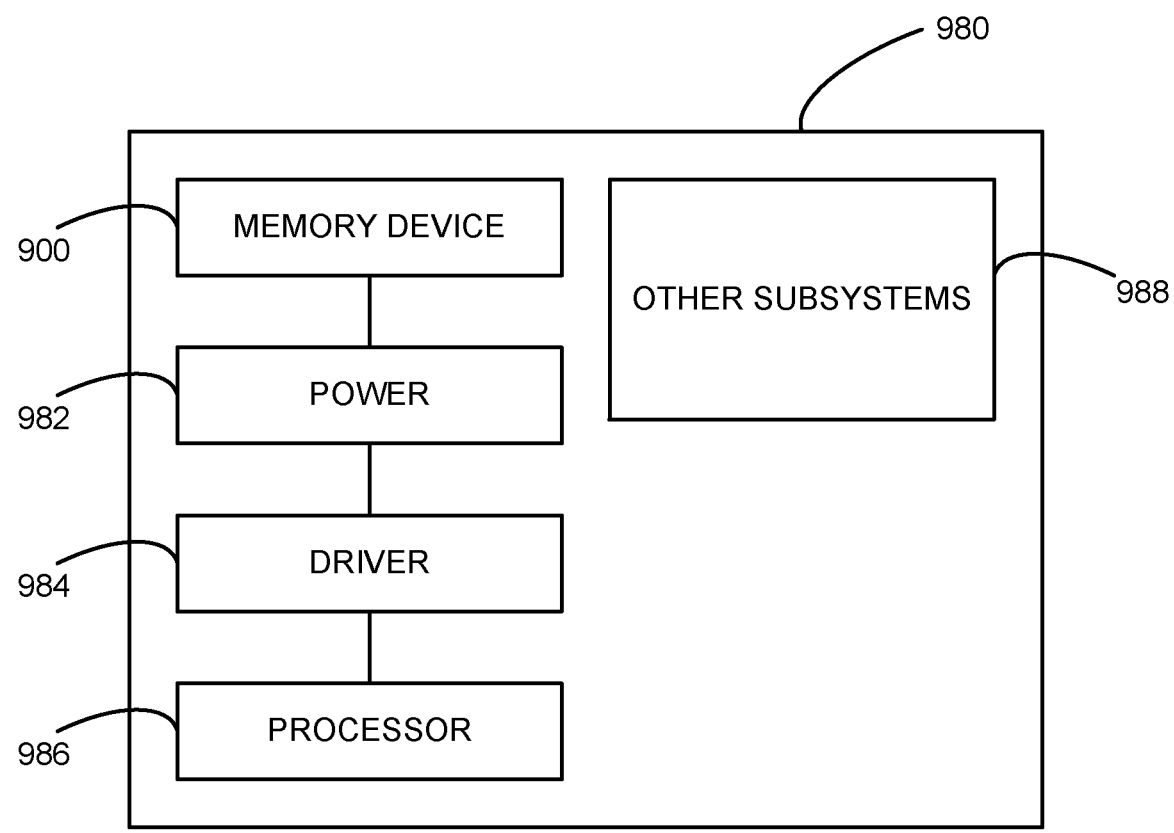
FIG. 9 is a schematic view of a system that includes a memory device in accordance with an embodiment of the present technology.

FIG. 9 is a schematic view of a system that includes a memory device in accordance with embodiments of the present technology. Any one of the foregoing memory devices described above with reference to FIGS. 1-8 can be incorporated into any of a myriad of larger and/or more complex systems, a representative example of which is system 980 shown schematically in FIG. 9. The system 980 can include a memory device 900, a power source 982, a driver 984, a processor 986, and/or other subsystems or components 988. The memory device 900 can include features generally similar to those of the memory device described above with reference to FIGS. 1-8, and can therefore include various features for performing a direct read request from a host device. The resulting system 980 can perform any of a wide variety of functions, such as memory storage, data processing, and/or other suitable functions. Accordingly, representative systems 980 can include, without limitation, hand-held devices (e.g., mobile phones, tablets, digital readers, and digital audio players), computers, vehicles, appliances and other products. Components of the system 980 may be housed in a single unit or distributed over multiple, interconnected units (e.g., through a communications network). The components of the system 980 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of DRAM devices. Memory devices configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-9.

We claim:

1. An apparatus, comprising:
   a master die;
   one or more slave dies;
   a ZQ resister between a first node and a second node coupled to a voltage terminal;
   a ZQ pad coupled to each of the first node of the ZQ resister, the master die and the one or more slave dies; and
   a calibration channel electrically coupling the master die and the one or more slave dies, the calibration channel configured to communicate signals between the master die and the one or more slave dies for coordinating access to the ZQ pad across the master die and the one or more slave dies.

2. The apparatus of claim 1, wherein the calibration channel includes a connection configured to communicate a clock between the master die and the one or more slave dies, wherein the clock is configured to coordinate timings for the master die and the one or more slave dies to access the ZQ pad.

3. The apparatus of claim 2, wherein the master die is configured to transmit the clock to the slave dies through the connection, wherein the clock is a common clock signal across the master die and the slave dies that is used to coordinate each die to exclusively access the ZQ pad.

4. The apparatus of claim 2, wherein each of the slave dies is configured to wait a unique number of clock cycles before accessing the ZQ pad.

5. The apparatus of claim 1, wherein the calibration channel includes a connection configured to communicate an enable between the master die and the one or more slave dies, wherein the enable is configured to allow one die amongst the master die and one or more of the slave dies access the ZQ pad at a time.

6. The apparatus of claim 5, wherein the master die is configured to transmit the enable to the slave dies through the connection, wherein the enable is a common enable signal across the master die and the slave dies.

7. The apparatus of claim 6, wherein the master die is configured to control a timing of the enable to generate either a background calibration start or a command calibration start.

8. The apparatus of claim 1, wherein the calibration channel includes transmitters in the master die and receivers in the slave dies, wherein the transmitters and the receivers are configured to communicate signals in one direction from the master die to the slave dies.

9. The apparatus of claim 1, wherein the memory device comprises a dynamic random-access memory (DRAM).

10. The apparatus of claim 9, wherein the DRAM is configured according to a Low Power 5 (LP5) specification, a double data rate (DDR) specification, or a combination thereof.

11. An apparatus, comprising:
a master die;
one or more slave dies;
a ZQ pad coupled to each of the master die and the one or more slave dies, the ZQ pad configured to provide a reference resistance level for a ZQ calibration process that tunes one or more resistance levels associated with output signal at a corresponding one of the master die and the one or more slave dies; and
a calibration channel electrically coupling the master die and the one or more slave dies, the calibration channel configured to communicate signals between the master die and the one or more slave dies for coordinating access to the ZQ pad across the master die and the one or more slave dies in implementing the ZQ calibration process.

12. The apparatus of claim 11, wherein the calibration channel includes a clock connection configured to communicate a calibration clock between the master die and the one or more slave dies, wherein the calibration clock is configured to coordinate timings associated with implementing the ZQ calibration process.

13. The apparatus of claim 12, wherein the master die is configured to transmit the calibration clock to the slave dies through the clock connection, wherein the calibration clock is a common clock signal across the master die and the slave dies used to coordinate each die to exclusively access the ZQ pad.

14. The apparatus of claim 12, wherein each of the slave dies is configured to wait a unique number of clock cycles before implementing the ZQ calibration process or a portion thereof, wherein the unique number of clock cycles is relative to the implement the ZQ calibration process or a portion thereof at the master die.

15. The apparatus of claim 12, wherein each of the slave dies is configured to:
calculate a die count based on counting the number of clock cycles;
access the ZQ pad when the die count matches a predetermined number unique to the each of the slave dies.

16. The apparatus of claim 12, wherein the calibration channel includes an enable connection configured to communicate a calibration enable between the master die and the one or more slave dies, wherein the calibration enable is configured to enable the ZQ calibration process across the master die, one or more of the slave dies, or a combination thereof.

17. The apparatus of claim 16, wherein the master die is configured to transmit the calibration enable to the slave dies through the enable connection, wherein the calibration enable is a common enable signal across the master die and the slave dies.

18. The apparatus of claim 17, wherein the master die is configured to control a timing of the calibration enable to generate either a background calibration start or a command calibration start.

19. The apparatus of claim 18, wherein each of the slave dies is configured to:
start counting a number of clock cycles for the calibration clock when the calibration enable transitions to a predetermined state; and
access the ZQ pad according to the number of clock cycles while the calibration enable maintains the predetermined state.

20. The apparatus of claim 11, wherein:
the master die is configured to access the ZQ pad before the one or more slave dies;
the one or more slave dies are configured to access the ZQ pad subsequent to the master die and at a unique timing according to the signals communicated through the calibration channel.

* * * * *